United States Patent
Wu et al.

(10) Patent No.: US 6,921,498 B2
(45) Date of Patent: Jul. 26, 2005

(54) NONLINEAR OPTICAL CRYSTALS OF COMPOUND $NA_3LA_9B_8O_{27}$ AND PRODUCING METHOD AND USES THEREOF

(75) Inventors: Yicheng Wu, Beijing (CN); Guochun Zhang, Beijing (CN); Peizhen Fu, Beijing (CN); Chuangtian Chen, Beijing (CN)

(73) Assignee: Technical Institute of Physics and Chemistry, CAS, Beijing (CN)

( * ) Notice: Subject to any disclaimer, the term of this patent is extended or adjusted under 35 U.S.C. 154(b) by 297 days.

(21) Appl. No.: 10/281,221

(22) Filed: Oct. 28, 2002

(65) Prior Publication Data

US 2003/0085378 A1 May 8, 2003

(30) Foreign Application Priority Data

Nov. 2, 2001 (CN) .......................... 01134393

(51) Int. Cl.[7] ............... F21V 9/00; G20F 1/35
(52) U.S. Cl. ..................... 252/582; 359/322
(58) Field of Search .................... 252/582; 359/322

(56) References Cited

U.S. PATENT DOCUMENTS

| | | | | |
|---|---|---|---|---|
| 4,761,202 A | * | 8/1988 | Bordui et al. .................. | 117/80 |
| 5,334,365 A | * | 8/1994 | Cheng ........................ | 423/596 |
| 5,485,802 A | * | 1/1996 | Altekruger et al. ........... | 117/14 |
| 5,523,026 A | * | 6/1996 | Chen et al. .................. | 252/582 |
| 5,684,813 A | * | 11/1997 | Keszler ....................... | 372/21 |
| 6,146,553 A | | 11/2000 | Wu et al. | |
| 6,417,954 B1 | * | 7/2002 | Reynolds et al. ........... | 359/330 |
| 2002/0000541 A1 | * | 1/2002 | Sasaki et al. ............... | 252/584 |

OTHER PUBLICATIONS

Graverau, Pierre et al., Na3La9O3(BO3)8, a new oxyborate in the temaey system Na2O–La2O3–B2O3: preparation and crystal structure, Solid State Sciences, 4 (Jun. 2002), 993–998.*

Dimitrov, Vesselin et al., Electronic polarizability, optical basicity and non-linear optical properties of oxide glasses, Journal of Non-Crystalline Solids, 249, 1999, 160–179.*

Zhang, Guochun et al., A New Nonlinear Optical Borate Crystal Na3La2(BO3)3, Chemistry Letters, 2001, 456–457.*

R. Norrestam et al., Structural Investigations of New Calcium—Rare Earth Oxybonates with the Composition Ca–4RO(BO3)3, Chem. Mater. 1992. 4, (737–743.

Boasheng Lu et al., "Excited Emission and Self–Frequency–Doubling Effect of NdxY1–xAL3(BO3)4 Crystal". Chinse Phys. Letter. vol. 3(9), 1986).

AA. Filmonov et al., "Nonlinear Optical Properties of Isomorphic Family of Crystals with Yttrium–Aluminium Borate (YAB) Structure". Kristall und Technik. vol. 9(1). 1974, pp. 63–66.

D. Xue et al.. Structural Analysis of Nonlinearities of Ca4ReO(BO3)3 (Re=La, Nd, Sm. Gd. Er. Y). Appl. Phys. A. (68). 1999, pp. 57–61.

* cited by examiner

Primary Examiner—Randy Gulakowski
Assistant Examiner—Timothy J Kugel
(74) Attorney, Agent, or Firm—Venable LLP; James R. Burdett; Lars Genieser

(57) ABSTRACT

The present invention relates to nonlinear optical crystals of compound $Na_3La_9B_8O_{27}$ and producing method and uses thereof. From the $Na_3La_9B_8O_{27}$ compound, large size single crystal of $Na_3La_9B_8O_{27}$ could be prepared by flux method. $Na_3La_9B_8O_{27}$ crystals are non-hygroscopic, and possess stronger nonlinear optical effect and good mechanical properties. They meet the requirements for the frequency conversion of blue—green wavelength lasers and could be used to prepare nonlinear optical devices.

10 Claims, 1 Drawing Sheet

NONLINEAR OPTICAL CRYSTALS OF COMPOUND $NA_3LA_9B_8O_{27}$ AND PRODUCING METHOD AND USES THEREOF

FIELD OF THE INVENTION

The present invention relates to a compound having chemical formula $Na_3La_9B_8O_{27}$, a nonlinear optical crystal, and the method for preparing the said crystal and the nonlinear optical devices made from the said crystals.

BACKGROUND OF THE INVENTION

Crystals having nonlinear optical (NLO) effect are called nonlinear optical crystals. The said nonlinear optical effects include those of frequency doubling, sum- and difference-frequency generation and parameter amplification. Only noncentrosymmetric crystal could probably possess the nonlinear optical effect. Utilizing the nonlinear optical effects of crystals, it is possible to prepare nonlinear optical devices such as second harmonic generator, up and down frequency converter, optical parametric oscillator and etc. Since the laser frequency could be converted by passing through nonlinear optical devices, many more lasers with useful wavelength could thus be obtained. As a result, much wider applications of the laser could be realized. An all-solid-state blue-green laser system could be realized by utilizing the conversion the frequency of near-infrared laser produced by a solid-state laser apparatus by a nonlinear optical crystal. Such systems have great potential applications in the field of laser technology. Among the nonlinear optical crystals, rare earth frequency-doubling crystals are a unique nonlinear optical material. Since rare earth ions have similar coordination structure and physicochemical properties, the crystal structure and NLO properties do not change dramatically when the rare earth ions are replaced partly or completely by different rare earth ions. Thus improvement of properties of this kind of materials could be easily achieved. Those well-known materials include $YAl_3(BO_3)_4$ [see former USSR journal *Kristall und Technik* Vol. 9,63, 1974], $Nd_xY_{1-x}Al_3(BO_3)_4$ [see *China Physics Letter* Vol. 3,413, 1986], $Ca_4RO(BO_3)_3$ (R=La, Gd, Sm, Er, Y, Lu) [see *Chemistry Material* Vol. 4,737, 1992] and $R_2MB_{10}O_{19}$ (R represents one or more elements selected from rare earth elements or Y; M selected from Ca, Sr, Ba) [see CN Patent Appl. 1,236, 027A and U.S. Pat. No. 6,146,553]. Their second harmonic generation effects are in the range of 2–3 times that of *potassium diphosphate*. i.e., KDP ($KH_2PO_4$). They could be used to prepare nonlinear optical device of wavelength range of blue—green light. Since energy conversion efficiency of laser frequency conversion of nonlinear optical crystal is related to the magnitude of nonlinear optical effect of the crystal, it is necessary to search for crystal materials with much larger nonlinear optical effect in order to raise the output power of the all-solid-state blue—green laser system.

SUMMARY OF THE INVENTION

According to one aspect of this invention, it provides a compound whose chemical formula could be represented by the following: $Na_3La_9B_8O_{27}$.

According to another aspect of the present invention, it further provides a nonlinear optical crystal of the said compound. The said crystal belongs to hexagonal system with space group of P$\bar{6}$2m. Its powder second harmonic generation (SHG) effect is 3–5 times that of KDP($KH_2PO_4$).

Further, the present invention provides a method for the preparation of $Na_3La_9B_8O_{27}$ crystal. The crystal can be grown by using flux method with $Na_2O/B_2O_3$ as the flux system and polycrystalline sample of $Na_3La_9B_8O_{27}$ as the solute, the molar ratio of $Na_2O/B_2O_3$ from 4/1 to 4/3 and the molar ratio of solute/flux from 1/5 to 1/10. The method includes the following steps. Pretreated raw materials in above-mentioned proportions were put into a crucible and melted. The crystals were allowed to grow at the surface of high temperature solution or in the hot solution and the rough crystals were post-treated. During the course of crystal growth, the temperature was lowered at a rate of 0.1° C.~5° C./day and the seed crystals or crucible could be optionally rotated at a rate of 0~100 rpm.

According to another aspect of the invention, it provides a nonlinear optical device, comprising means to direct at least one incident beam of electromagnetic radiation into at least one crystal having NLO properties, whereby electromagnetic radiation emerging from said crystal contains at least one frequency different from that of any incident beam of electromagnetic radiation, wherein said nonlinear optical crystal is a single crystal of $Na_3La_9B_8O_{27}$.

The method for preparing the compound $Na_3La_9B_8O_{27}$ of the present invention is characterized in that raw materials containing $Na_2O$, $La_2O_3$ and $B_2O_3$ in molar ratio of 3:9:8 were mixed homogeneously and then chemically reacted. The said raw material compounds may be oxides, carbonates, nitrates, oxalates, borates or hydroxides of Na and La, and $H_3BO_3$ or $B_2O_3$.

In principle, it is possible to prepare $Na_3La_9B_8O_{27}$ from the above-mentioned system by using common chemical synthetic methods. Among them, a solid-state reaction method is preferred. Specifically, raw materials composed of $Na_2O$, $La_2O_3$ and $B_2O_3$ in molar ratio of 3:9:8 were mixed homogeneously and then were heated to carry out the solid-state reaction to yield compound with chemical formula of $Na_3La_9B_8O_{27}$.

The typical reactions for synthesizing $Na_3La_9B_8O_{27}$ are listed as follows:

(1) $3Na_2CO_3+9La_2O_3+16H_3BO_3 \rightarrow 2Na_3La_9B_8O_{27}+3CO_2\uparrow+24H_2O\uparrow$ (2) $6Na_2C_2O_4+18La_2O_3+32H_3BO_3 \rightarrow 4Na_3La_9B_8O_{27}+12CO\uparrow+48H_2O\uparrow+3O_2\uparrow$ (3) $3Na_2O+9La_2O_3+16H_3BO_3 \rightarrow 2Na_3La_9B_8O_{27}+24H_2O\uparrow$ (4) $12NaNO_3+18La_2O_3+32H_3BO_3 \rightarrow 4Na_3La_9B_8O_{27}+12NO_2\uparrow+48H_2O\uparrow+3O_2\uparrow$ (5) $6NaOH+9La_2O_3+16H_3BO_3 \rightarrow 2Na_3La_9B_8O_{27}+27H_2O\uparrow$ (6) $3Na_2O+9La_2O_3+8B_2O_3 \rightarrow 2Na_3La_9B_8O_{27}$ (7) $6Na_2O+36La(NO_3)_3+16B_2O_3 \rightarrow 4Na_3La_9B_8O_{27}+108NO_2\uparrow+27O_2\uparrow$ (8) $3Na_2O+9La_2(CO_3)_3+16H_3BO_3 \rightarrow 2Na_3La_9B_8O_{27}+27CO_2\uparrow+24H_2O\uparrow$ (9) $3Na_2CO_3+9La_2(CO_3)_3+16H_3BO_3 \rightarrow 2Na_3La_9B_8O_{27}+30CO_2\uparrow+24H_2O\uparrow$ The present invention provides a kind of nonlinear optical crystal which is characterized in that: its chemical formula is $Na_3La_9B_8O_{27}$; said crystal has no symmetrical center, belongs to hexagonal crystal system, has a space group of P$\bar{6}$2m; and the cell parameters are as follows: a=8.9229(13) Å, b=8.9229(13) Å, c=8.7366(17) Å, α=β=90°, γ=120°, Z=1, V=602.4 Å$^3$, density: 5.066 g/cm$^3$.

This method for preparing nonlinear optical crystals with chemical formula of $Na_3La_9B_8O_{27}$ is characterized in that: the crystals are growing by using flux method with $Na_2O$—$B_2O_3$ as the flux system having a molar ratio of $Na_2O/B_2O_3$ from 4/1 to 4/3 and polycrystalline sample of $Na_3La_9B_8O_{27}$ as the solute having a molar ratio of solute/flux from 1/5 to 1/10. The method includes the following steps. Pretreated raw materials in above-mentioned proportions were put into a crucible and melted. The crystals were allowed to grow at the surface of high temperature solution or in the hot solution and the rough crystals were post-treated. The said raw material compounds could be oxides, carbonates, nitrates, borates, or hydroxides of Na and La, and $H_3BO_3$ or $B_2O_3$. In the course of preparing raw materials, a compound of $Na_3La_9B_8O_{27}$ can be firstly prepared and then mixed with flux system with the molar ratio of solute/flux of 1/5~1/10, alternatively, the raw materials can also be directly weighed according to the stoichiometric proportion of $Na_3La_9B_8O_{27}$ and then mixed with the flux system in proper proportion. After mixing homogeneously, the said raw materials are put into a crucible and heated to melt and kept at temperature for a definite time. Then the temperature is lowered to a point slightly higher than that of the saturation temperature. The seed crystal equipped on the seed crystal shank is dipped into the high temperature solution in the crucible and the rotation mechanism of the shank is started to a rate of 0~100 rpm. After keeping the temperature constant for a definite time, lowering the temperature quickly to saturation temperature and then lowering the temperature slowly at a rate of 0.1~5° C./day. In the course of crystal growth, the rate of crystal growth could be controlled by adjusting rate of temperature lowering, rate of rotation of crystals or combination of the two effects. After the single crystal grows to desired size, lifting the seed crystal shank to keep crystal out of liquid surface. The crystal is still kept in the growth furnace for annealing and the temperature is allowed to lower to room temperature in a rate not more than 100° C./hour.

This method for preparing nonlinear optical crystals with chemical formula of $Na_3La_9B_8O_{27}$ is characterized in that: the crystals are growing by using flux method with $Na_2O$—$B_2O_3$ as the flux system having a molar ratio of $Na_2O/B_2O_3$ from 4/1 to 4/3 and the polycrystalline sample of $Na_3La_9B_8O_{27}$ as the solute having a molar ratio of solute/flux from 1/5 to 1/10. The method includes the following steps. Pretreated raw materials in above-mentioned proportions were put into a crucible and melted. The crystals were allowed to grow at the surface of the high temperature solution or in the hot solution and the rough crystals were post-treated. The said raw material compounds could be oxides, carbonates, nitrates, borates, or hydroxides of Na and La, and $H_3BO_3$ or $B_2O_3$. In the course of preparing raw materials, the compound of $Na_3La_9B_8O_{27}$ can be firstly prepared and then mixed with flux system with the molar ratio of solute/flux of 1/5~1/10, alternatively, the raw materials can also be directly weighed according to the stoichiometric proportion of $Na_3La_9B_8O_{27}$ and then mixed with flux system in proper proportion. The growth device for $Na_3La_9B_8O27$ single crystal is a high temperature furnace which could be heated up to at least 1180° C. and is equipped with a precision temperature controlling system with a precision of ±0.5° C. Crucibles could be accommodated in the heated cabinet. A seed crystal shank is placed above the furnace. Seed crystals could be charged at the lower end of the shank. A rotation mechanism enabling the seed crystal shank to rotate around the axis is fixed at the upper end of the shank. The said shank could also move vertically, and thus it can be stretched to an appropriate position of the open crucible and the crystal on the shank can be lifted out of liquid surface. Putting the opened crucible charged with homogeneously mixed raw materials in proper proportion into high temperature furnace and the opening of the furnace is sealed with heat insulating material. Then the furnace is quickly heated to 1100° C.~1180® C. at a rate of 50° C.~20° C./hour. Keeping the temperature constant for 10–50 hours to ensure complete melting and homogeneity of the raw materials for crystal growth and complete expulsion of the volatile components of the solution. Then the temperature is lowered quickly to a temperature of 5° C.~20° C. higher than the saturation temperature. Slowly dipping the seed crystal carrying shank into the solution in the crucible while starting the rotation mechanism of the shank to a rate of 0~100 rpm. After keeping the temperature constant for half an hour, lowering the temperature quickly to saturation temperature and then lowering the temperature slowly at a rate of 0.1° C.~5° C./day. In the course of crystal growth, the rate of crystal growth could be controlled by adjusting rate of temperature lowering, rate of rotation of crystals or combination of the two effects. After single crystal grows to desired size, lifting the seed crystal shank to keep crystal out of liquid surface. The crystal is still kept in the growth furnace for annealing and the temperature is allowed to lower to room temperature in a rate not more than 100° C./hour. The preferred rate of lowering of temperature is 30–50° C/hour.

By using the above-mentioned method, $Na_3La_9B_8O_{27}$ single crystals with a size of centimeter level could be obtained. If a larger crucible is used and longer growth time is adopted, corresponding larger size single crystals could be obtained.

Crystal post-treatment and optical fabrication methods are as follows: after single crystal growth ends, lifting the crystal out of solution surface. The crystal is still kept in the growth furnace for annealing and the temperature is lowered to room temperature in a rate less than 100° C./hour. The preferred rate of lowering of the temperature is 30–50° C./hour. Based on the crystallographic data, rough crystal is oriented and cut in accordance with the desired angle, thickness and cross section dimensions. After the incident surface is polished, the crystal could be used as nonlinear optical device.

The present $Na_3La_9B_8O_{27}$ crystals have the advantages of higher stability of physiochemical properties, higher rigidity, better mechanical properties, better cracking resistance, better deliquescence resistance, easier fabrication and longer life of storage. The transmissivity of the said crystals in the range of 270~2200 nm is 40~80% and the powder SHG coefficient of the crystal is 3–5 times that of $KDP(KH_2PO_4)$.

$Na_3La_9B_8O_{27}$ single crystal provided by the present invention could be used to prepare a nonlinear optical device which directs at least one incident beam of electromagnetic radiation into at least one nonlinear optical crystal and then produce at least one output electromagnetic radiation beam with a frequency different from that of the incident electromagnetic radiation. The device is characterized by that the said nonlinear optical crystal is a single crystal of $Na_3La_9B_8O_{27}$.

In the following, the present nonlinear optical device made of $Na_3La_9B_8O_{27}$ single crystal is described in detail referring to FIG. 1. Laser beam 2 generated from laser generator 1 pass through $Na_3La_9B_8O_{27}$ single crystal 3, and the resulting departing beam 4 pass through filter 5, and then a desired laser beam is obtained. The said nonlinear optical device could be used as frequency doubling generator, up and down frequency converter, optical parametric oscillator and the like. Laser generator 1 could be a Nd:YAG laser generator or other laser generators. If a Nd:YAG laser generator is used as light source of a frequency doubling device, the incident beam 2 is an infrared beam with a wavelength of 1064 nm. When the said infrared beam passes through the single crystal, green light with a wavelength of 532 nm will be produced. Then the departing beam 4 comprises infrared light of a wavelength of 1064 as well as green light of a wavelength of 532 nm. The function of filter 5 is to filter off the infrared component and only allow frequency-doubled green light to pass.

The contribution of the present invention is that it provides a compound having the chemical formula of $Na_3La_9B_8O_{27}$ and their nonlinear optical crystals, and the preparation method thereof and the nonlinear optical devices made from the said crystals. Since a $Na_2O$—$B_2O$ flux system is used in growing the $Na_3La_9B_8O_{27}$ single crystals, no other ions could enter the crystal lattice. As a result, the product will have higher purity and the crystals obtained are transparent without inclusion and are easier to grow bigger. The said method has the advantages of quicker growth rate, low cost and ease of obtaining larger sized crystals. $Na_3La_9B_8O_{27}$ single crystals thus obtained have the advantages of wider transmissible wavelength range, higher rigidity, better mechanical properties, better cracking resistance, better deliquescence resistance, easier fabrication and longer life of storage. Nonlinear optical devices made with a nonlinear optical crystal of the present invention could emit green laser light having wavelength of 532 nm at room temperature, if a Q-switched Nd:YAG laser generator is used as the light source and the incident light is infrared light of wave length of 1064 nm. The intensity of the laser obtained is 3–5 times that of KDP($KH_2PO_4$).

PREFERRED EMBODIMENTS OF THE PRESENT INVENTION

EXAMPLE 1

Figure 1:
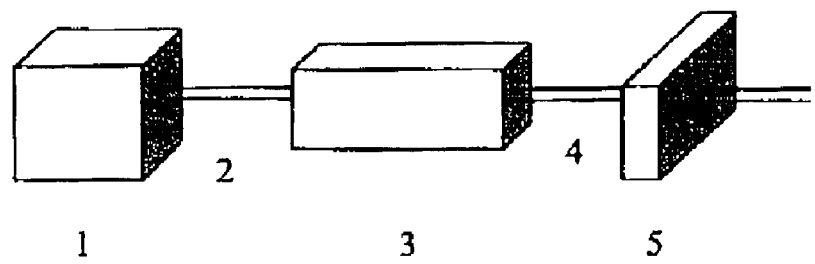
FIG. 1 is a schematic illustration of the working principle of a typical nonlinear optical device made of the present $Na_3La_9B_8O_{27}$ single crystal, wherein, 1 is the laser generator, 2 is the incident laser beam, 3 is post-treated and optically fabricated $Na_3La_9B_8O_{27}$ single crystal and 5 is filter.

Preparation of powder form $Na_3La_9B_8O_{27}$ compound:

Solid-state reaction method was used. The reaction equation is as follows:

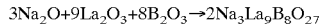
$$3Na_2O+9La_2O_3+8B_2O_3 \rightarrow 2Na_3La_9B_8O_{27}$$

The amounts of the above-mentioned 3 reagents used were: $Na_2O$: 5.578 g (0.09 mol); $La_2O_3$: 87.968 g (0.27 mol); $B_2O_3$: 16.708 g (0.24 mol).

Reagents were weighed according to above-mentioned quantities and were put in a mortar and then mixed and ground carefully. The mixture was put in a lidless platinum crucible of size of Φ50 mm×50 mm and was compacted by pressing. The said crucible was put into a muffle furnace and was heated at a rate of 50° C./hour to 500° C. slowly and the temperature was kept at this temperature for 24 hours. After being cooled down, the loose and porous sample was taken out of the crucible and was once again mixed thoroughly, ground and put back to the crucible and compacted. The said crucible together with the compacted sample was sintered at 1140° C. for 24 hours. At this time, the sample shrank into a clump. The sample was then taken out and pulverized and ground in a mortar to yield the final compound. The melting point of $Na_3La_9B_8O_{27}$ determined by differential thermal analysis is 1183° C.

EXAMPLE 2

Preparation of powder form $Na_3La_9B_8O_{27}$ compound:

Solid-state reaction method was used. The reaction equation is as follows:

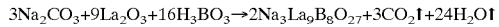
$$3Na_2CO_3+9La_2O_3+16H_3BO_3 \rightarrow 2Na_3La_9B_8O_{27}+3CO_2\uparrow+24H_2O\uparrow$$

The amounts of the above-mentioned 3 reagents used were as follows:

$Na_2CO_3$: 9.539 g (0.09 mol);
$La_2O_3$: 87.968 g (0.27 mol);
$H_3BO_3$: 29.678 g (0.48 mol).

Reagents were weighed according to above-mentioned quantities and were put in a mortar to be mixed and ground carefully. The mixture was put in a lidless platinum crucible of size of Φ50 mm×50 mm and was compacted by pressing. The said crucible was put into a muffle furnace and was heated at a rate of 50° C./hour to 500° C. slowly and the temperature was kept at this temperature for 24 hours, After being cooled down, the loose and porous sample was taken out of and crucible and was once again mixed thoroughly, ground and put back to the crucible and compacted. The said crucible together with the compacted sample was sintered at 1120° C. for 48 hours. At that time, the sample shrank into a clump. The sample was then taken out and pulverized and ground in a mortar to yield the final compound.

EXAMPLE 3

Preparation of $Na_3La_9B_8O_{27}$ compound in the form of powder:

Solid-state reaction method was used. The reaction equation is as follows:

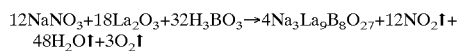
$$12NaNO_3+18La_2O_3+32H_3BO_3 \rightarrow 4Na_3La_9B_8O_{27}+12NO_2\uparrow+48H_2O\uparrow+3O_2\uparrow$$

The amounts of the above-mentioned 3 reagents used were as follows:

$NaNO_3$: 15.300 g (0.18 mol);
$La_2O_3$: 87.968 g (0.27 mol);
$H_3BO_3$: 29.678 g (0.48 mol).

Reagents were weighed according to above-mentioned quantities and were put in a mortar to be mixed and ground carefully. The mixture was put in a lidless platinum crucible of size of Φ50 mm×50 mm and was compacted by pressing. The said crucible was put into a muffle furnace and was heated at a rate of 50° C./hour to 500° C. slowly and the temperature was kept at this temperature for 24 hours. Having been cooled down, the loose and porous sample was taken out of and crucible and was once again mixed thoroughly, ground and put back to the crucible and compacted. The said crucible together with the compacted sample was sintered at 1110° C. for 30 hours. At that time, the sample shrank into a clump. The sample was then taken out and pulverized and ground in a mortar to yield the final compound.

EXAMPLE 4

Preparation of $Na_3La_9B_8O_{27}$ compound in the form of powder:

Solid-state reaction method was used. The reaction equation is as follows:

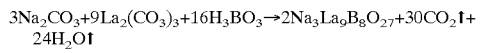
$$3Na_2CO_3+9La_2(CO_3)_3+16H_3BO_3 \rightarrow 2Na_3La_9B_8O_{27}+30CO_2\uparrow+24H_2O\uparrow$$

The amounts of the above-mentioned 3 reagents used were as follows:

$Na_2CO_3$: 9.539 g (0.09 mol);
$La_2(CO_3)_3$: 123.616 g (0.27 mol);
$H_3BO_3$: 29.678 g (0.48 mol).

Reagents were weighed according to above-mentioned quantities and were put in a mortar to be mixed and ground carefully. The mixture was put in a lidless platinum crucible of size of Φ50 mm×50 mm and was compacted by pressing. The said crucible was put into a muffle furnace and was heated at a rate of 50° C./hour to 500° C. slowly and the temperature was kept at this temperature for 24 hours. Having been cooled down, the loose and porous sample was taken out of and crucible and was once again mixed thoroughly, ground and put back to the crucible and compacted. The said crucible together with the compacted sample was sintered at 1090° C. for 48 hours. At that time, the sample shrank into a clump. The sample was then taken out and pulverized and ground in a mortar to yield the final compound.

EXAMPLE 5

Preparation of $Na_3La_9B_8O_{27}$ crystal by flux method:

The molar ratio of flux $Na_2O/B_2O_3$ was selected at 2/1 and the molar ratio of solute/solvent (ratio of solute molar number to solvent total molar number) was selected at 1/8.25. Thus, 48.225 g of $Na_2CO_3$, 95.299 g of $La_2O_3$, 54.386 g of $H_3BO_3$ (corresponding to $Na_3La_9B_8O_{27}:Na_2O:B_2O_3=1:5.5:2.75$) were weighed, mixed homogeneously and put into a Φ80 mm×60 mm lidless platinum crucible which was then moved to a muffle furnace and the furnace was slowly heated to 700° C. and kept at this temperature for 24 hours. Having been cooled down, the sample was pulverized in a mortar and was transferred in batches to a Φ50 mm×50 mm lidless platinum crucible. The said crucible with the content was placed in a vertical type single crystal growth furnace whose opening at the top part of the furnace was sealed with an insulating material. A small hole for the seed crystal shank to come in or go out was reserved at the place of the top of the furnace corresponding to the center of the crucible. The growth furnace was quickly heated to 1180° C., kept at that temperature for 30 hours and then quickly cooled down to 1150° C. Meanwhile, the seed crystals were fixed at the lower part of the seed crystal shank with platinum wire and then was introduced into the crucible through the small hole at the top of the growth furnace till contacting the surface of the liquid therein. The seed crystals were kept at this temperature for half an hour while rotating at a rate of 20 rpm. The temperature of the furnace was first lowered quickly to 1140° C. and then lowered at a rate of 0.2° C./day. After the growth of crystal ended, the crystal was lifted out of liquid surface. The temperature of the crystal was then lowered to room temperature at a rate of 30° C./hour. As a result, transparent $Na_3La_9B_8O_{27}$ crystal with a size of 12 mm×6 mm×3 mm was obtained.

EXAMPLE 6

Preparation of $Na_3La_9B_8O_{27}$ crystal by flux method:

The molar ratio of flux $Na_2O/B_2O_3$ was selected at 2/1 and the molar ratio of solute/solvent (ratio of solute molar number to solvent total molar number) was selected at 1/6. Thus, 40.806 g of $Na_2CO_3$, 102.630 g of $La_2O_3$, 51.937 g of $H_3BO_3$ (corresponding to $Na_3La_9B_8O_{27}:Na_2O:B_2O_3=1:4:2$) were weighed, mixed homogeneously and put into a Φ80 mm×60 mm lidless platinum crucible which was then moved to a muffle furnace and the furnace was slowly heated to 700° C. and kept at this temperature for 24 hours. Having been cooled down, the sample was pulverized in a mortar and was transferred in batches to a Φ50 mm×50 mm lidless platinum crucible. The said crucible with the content was placed in a vertical type single crystal growth furnace whose opening at the top part of the furnace was sealed with an insulating material. A small hole for entering and exiting of the seed crystal shank was reserved at the place of the top of the furnace corresponding to the center of the crucible. The growth furnace was quickly heated to 1180° C., kept at that temperature for 30 hours and then quickly cooled down to 1160° C. Meanwhile, seed crystals were fixed at the lower part of the seed crystal shank with platinum wire and was introduced into the crucible through the small hole at the top of the growth furnace till contacting the surface of the liquid therein. The seed crystals were kept at this temperature for half an hour while rotating at a rate of 20 rpm. The temperature of the furnace was first lowered quickly to 1150° C. and then lowered at a rate of 0.2° C./day. After the growth of crystal ended, the crystal was lifted out of liquid surface. The temperature of the crystal was then lowered to room temperature at a rate of 30° C./hour. As a result, transparent $Na_3La_9B_8O_{27}$ crystal with a size of 8 mm×5 mm×3 mm was obtained.

EXAMPLE 7

Preparation of $Na_3La_9B_8O_{27}$ crystal by flux method:

The molar ratio of flux $Na_2O/B_2O_3$ was selected at 2/1 and the molar ratio of solute/solvent (ratio of solute molar number to solvent total molar number) was selected at 1/9. Thus, 55.645 g of $Na_2CO_3$, 102.629 g of $La_2O_3$, 60.593 g of $H_3BO_3$ (corresponding to $Na_3La_9B_8O_{27}:Na_2O:B_2O_3=1:6:3$) were weighed, mixed homogeneously and put into a Φ80 mm×60 mm lidless platinum crucible which was then moved to a muffle furnace and the furnace was slowly heated to 700° C. and kept at this temperature for 24 hours. Having been cooled down, the sample was pulverized in a mortar and was transferred in batches to a Φ50 mm×50 mm lidless platinum crucible. The said crucible was then placed in a vertical type single crystal growth furnace whose opening at the top part of the furnace was sealed with an insulating material. A small hole for entering and exiting of the seed crystal shank was reserved at the place of the top of the furnace corresponding to the center of the crucible. The growth furnace was quickly heated to 1180° C., kept at that temperature for 24 hours and then quickly cooled down to 1145° C. Meanwhile, seed crystals were fixed at the lower part of the seed crystal shank with platinum wire and was introduced into the crucible through the small hole at the top of the growth furnace till immersing completely into the melt therein. The seed crystals were kept at this temperature for half an hour while rotating at a rate of 20 rpm. The temperature of the furnace was first lowered quickly to 1135° C. and then lowered at a rate of 0.2° C./day. After the growth of crystal ended, the crystal was lifted out of liquid surface. The temperature of the crystal was then lowered to room temperature at a rate of 30° C./hour. A transparent $Na_3La_9B_8O_{27}$ crystal with a size of 10 mm×5 mm×3 mm was obtained.

EXAMPLE 8

Preparation of $Na_3La_9B_8O_{27}$ crystal by flux method:

$Na_3La_9B_8O_{27}$ powder synthesized in Example 2 was used as the raw material. $Na_2CO_3$ and $H_3BO_3$ of analytical grade were used as flux. The molar ratio of the raw materials was $Na_3La_9B_8O_{27}:Na_2CO_3:H_3BO_3=1:6.7:3.3$. Thus, 124.959 g of $Na_3La_9B_8O_{27}$ powder, 48.049 g of $Na_2CO_3$ and 14.015 g of $H_3BO_3$ [corresponding to the molar ratio of solvent $Na_2O/B_2O_3$ being 4/1 and the molar ratio of solute/solvent being 1/8.4(ratio of solute molar number to solvent total molar number)]were weighed, mixed homogeneously and put into a Φ50 mm×50 mm lidless platinum crucible. The said crucible was then placed in a vertical type single crystal growth furnace whose opening at the top part of the furnace was sealed with an insulating material. A small hole for entering and exiting of the seed crystal shank was reserved at the place of the top of the furnace corresponding to the center of the crucible. The growth furnace was quickly heated to 1150° C., kept at that temperature for 30 hours and then quickly cooled down to 1135° C. Meanwhile, the seed crystals were fixed at the lower part of the seed crystal shank with platinum wire and was introduced into the crucible through the small hole at the top of the growth furnace till contacting the surface of the liquid therein. The seed crystals were kept at this temperature for half an hour while rotating at a rate of 20 rpm. The temperature of the furnace was first lowered quickly to 1125° C. and then lowered at a rate of 0.2° C./day. After the growth of crystal ended, the crystal was lifted out of liquid surface. The temperature of the crystal was then lowered to room temperature at a rate of 30° C./hour. Transparent $Na_3La_9B_8O_{27}$ crystal with size of centimeter level was obtained.

EXAMPLE 9

Preparation of $Na_3La_9B_8O_{27}$ crystal by flux method:

$Na_3La_9B_8O_{27}$ powder synthesized in Example 2 was used as the raw material. $Na_2CO_3$ and $H_3BO_3$ of analytical grade were used as flux. The molar ratio of the raw materials was $Na_3La_9B_8O_{27}$: $Na_2CO_3$:$H_3BO_3$=1:4:6. Thus, 123.122 g of $Na_3La_9B_8O_{27}$ powder, 28.405 g of $Na_2CO_3$ and 25.227 g of $H_3BO_3$ [i.e., the molar ratio of flux $Na_2O/B_2O_3$ is 4/3 and the molar ratio of solute/solvent is 1/7(ratio of solute molar number to solvent total molar number)]were weighed, mixed homogeneously and put into a Φ50 mm×50 mm lidless platinum crucible. The said crucible was then placed in a vertical type single crystal growth furnace whose opening at the top part of the furnace was sealed with an insulating material. A small hole for entering and exiting of the seed crystal shank was reserved at the place of the top of the furnace corresponding to the center of the crucible. The growth furnace was quickly heated to 1150° C., kept at that temperature for 30 hours and then quickly cooled down to 1140° C. Meanwhile, seed crystals were fixed at the lower part of the seed crystal shank with platinum wire and was introduced into the crucible through the small hole at the top of the growth furnace till immersing completely into the melt therein. The seed crystals were kept at this temperature for half an hour while rotating at a rate of 20 rpm. The temperature of the furnace was first lowered quickly to 1130° C. and then lowered at a rate of 0.2° C./day. After the growth of crystal ended, the crystal was lifted out of liquid surface. The temperature of the crystal was then lowered to room temperature at a rate of 30° C./hour. As a result, transparent $Na_3La_9B_8O_{27}$ crystal with a size at the centimeter level was obtained.

EXAMPLE 10

Transmission spectra of $Na_3La_9B_8O_{27}$ crystal obtained in Example 5 were measured. It was found that the crystal was transparent in the wavelength range of 270 nm to 2200 nm. The crystal had better cracking resistance, better deliquescence resistance, easiness of being polished and fabricated and longer life of storage. The said crystal was placed at the position of 3 as shown in the attached figure. When Q-switched Nd:YAG laser generator was used as the light source and the incident light was an infrared beam with wavelength of 1064 nm, the departing laser was a green light with wavelength of 532 nm. The intensity of the departing laser was 3–5 times that of KDP.

What is claimed is:

1. A compound having the formula of $Na_3La_9B_8O_{27}$.

2. A process for producing the compound of claim 1, comprising the steps of mixing raw materials containing $Na_2O$ and $La_2O_3$ and $B_2O_3$ in a molar ratio of 3:9:8, and allowing the chemosynthesis reaction to proceed.

3. The process according to claim 2, wherein the raw materials are selected from the group consisting of the oxides, carbonates, nitrates, oxalates, borates and hydroxides of Na and La, $H_3BO_3$ and $B_2O_3$.

4. A nonlinear optical crystal, which has a chemical formula of $Na_3La_9B_8O_{27}$, has no symmetric center, belongs to hexagonal crystal system and has a space group of $P\bar{6}2m$.

5. A process for preparing a nonlinear optical crystal according to claim 4, comprising:

(a) mixing and grinding raw materials comprising:
   (A) $Na_2O$ and $B_2O_3$ as the flux system; and
   (B) polycrystalline sample of $Na_3La_9B_8O_{27}$, or the raw materials containing $Na_2O$ and $La_2O_3$ and $B_2O_3$ in a molar ratio of 3:9:8, as the solute;
wherein, the molar ratio of $Na_2O/B_2O_3$ is from 4/1 to 4/3, and the molar ratio of solute/flux is from 1/5 to 1/10;

(b) melting the ground mixture;

(c) growing the crystals on the surface of solution or in the solution to a desired size;

(d) post-treating the rough crystals.

6. The process according to claim 5, wherein said raw materials are selected from the group consisting of oxides, carbonates, nitrates, oxalates, borates and hydroxides of Na and La, and $H_3BO_3$ and $B_2O_3$.

7. The process according to claim 6, wherein, during the course of crystal growth in step (c), the temperature is lowered at a rate of 0.1° C.~5° C./day and seed crystal was rotated at a rate of 0~100 rpm.

8. The process according to claim 6, wherein, the step (d) further comprises the following steps: raising seed crystal shank; lifting the crystal out of liquid surface; and lowering the temperature of the crystal to room temperature at a rate of not more than 100° C./hour.

9. A nonlinear optical device, comprising a nonlinear optical crystal which has a chemical formula of $Na_3La_9B_8O_{27}$, has no symmetric center, belongs to hexagonal crystal system and has a space group of $P\bar{6}2m$.

10. The nonlinear optical device as claimed in claim 9, further comprising means to direct at least one incident beam of electromagnetic radiation into at least one nonlinear optical crystal to produce at least one beam of output radiation whose frequency is different from that of incident electromagnetic radiation.

* * * * *